(12) United States Patent
Tokuda et al.

(10) Patent No.: US 6,493,062 B2
(45) Date of Patent: Dec. 10, 2002

(54) DRIVING APPARATUS AND EXPOSURE APPARATUS

(75) Inventors: Yukio Tokuda, Kawasaki (JP); Nobuyoshi Deguchi, Tochigi-ken (JP); Shigeyuki Uzawa, Tokyo (JP); Yukio Takabayashi, Utsunomiya (JP); Hiromichi Hara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/286,447

(22) Filed: Apr. 6, 1999

(65) Prior Publication Data

US 2002/0054280 A1 May 9, 2002

(30) Foreign Application Priority Data

Apr. 8, 1998 (JP) .......................................... 10-095895

(51) Int. Cl.$^7$ ..................... G03B 27/42; G03B 27/58; G03B 27/62
(52) U.S. Cl. ............... 355/53; 355/72; 355/75
(58) Field of Search ............... 355/53, 72, 76, 355/95, 75; 248/550, 562; 318/649; 310/10, 12

(56) References Cited

U.S. PATENT DOCUMENTS

| | | | | |
|---|---|---|---|---|
| 4,473,292 A | * | 9/1984 | Mayer | 355/53 |
| 4,927,119 A | * | 5/1990 | Frost | 248/550 |
| 4,976,415 A | * | 12/1990 | Murai et al. | 267/136 |
| 5,128,975 A | | 7/1992 | Iwamoto et al. | 378/34 |
| 5,155,523 A | | 10/1992 | Hara et al. | 355/53 |
| 5,187,519 A | | 2/1993 | Takabayashi et al. | 355/53 |
| 5,356,110 A | * | 10/1994 | Eddy | 248/550 |
| 5,446,519 A | * | 8/1995 | Makinouchi | 355/53 |
| 5,549,269 A | * | 8/1996 | Gartel et al. | 248/550 |
| 5,610,686 A | * | 3/1997 | Osanai | 355/72 |
| 5,691,806 A | | 11/1997 | Tokuda et al. | 355/72 |
| 5,765,800 A | * | 6/1998 | Watanabe et al. | 248/550 |
| 5,876,012 A | * | 3/1999 | Haga et al. | 248/550 |
| 5,881,987 A | * | 3/1999 | Hara | 248/562 |
| 5,909,272 A | * | 6/1999 | Osanai et al. | 355/53 |
| 5,931,441 A | * | 8/1999 | Sakamoto | 248/550 |
| 5,933,215 A | * | 8/1999 | Inoue et al. | 355/53 |
| 5,959,427 A | * | 9/1999 | Watson | 318/687 |
| 6,002,987 A | * | 12/1999 | Kamiya et al. | 702/56 |
| 6,021,991 A | * | 2/2000 | Mayama et al. | 248/550 |
| 6,036,162 A | * | 3/2000 | Hayashi | 248/550 |
| 6,087,797 A | * | 7/2000 | Lee | 318/649 |
| 6,222,614 B1 | * | 4/2001 | Ohtomo | 355/53 |
| 6,327,024 B1 | * | 12/2001 | Hayashi et al. | 355/53 |

FOREIGN PATENT DOCUMENTS

| | | |
|---|---|---|
| JP | 1-188241 | 7/1989 |
| JP | 3-245932 | 11/1991 |
| JP | 5-77126 | 3/1993 |
| JP | 5-121294 | 5/1993 |
| JP | 6-267823 | 9/1994 |

\* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

A driving apparatus for moving an object has a stage which moves the object mounted thereon, a base member supporting the stage, a reaction force reception structure for receiving a reaction force generated upon driving the stage, a damp member for damping transmission of vibration with a predetermined frequency range from the reaction force reception structure to a floor and an actuator for generating a force between the base member and the reaction force reception structure.

57 Claims, 6 Drawing Sheets

DRIVING APPARATUS AND EXPOSURE APPARATUS

BACKGROUND OF THE INVENTION

1. Field of the Invention

The present invention relates to a driving apparatus for moving an object and an exposure apparatus including the same.

2. Description of the Related Art

Conventionally, as typical exposure apparatuses used to manufacture semiconductor devices or the like, there are step-and-repeat exposure apparatuses (also referred to as steppers) which sequentially transfer the pattern of a master (reticle or mask) onto a plurality of exposure regions on a substrate (wafer or glass substrate) by exposure while moving the substrate stepwise, or step-and-scan exposure apparatuses (also referred to as scanners) which repeat step movement and scanning exposure to repeatedly transfer a pattern onto a plurality of regions on a substrate by exposure. Especially, the step-and-scan exposure apparatuses are expected to be a mainstream in the future because they limit light through a slit and use only a portion relatively close to the optical axis of the projection optical system, and therefore, allow exposure using a precise and wide-angled fine pattern.

Such an exposure apparatus has a stage unit (wafer stage or reticle stage) for moving a wafer or a reticle at a high speed and positioning it. When the stage is driven, the inertial force generates a reaction force in accordance with acceleration/deceleration. This reaction force is transmitted to a platen to swing or vibrate it. This may excite natural vibration of the mechanical system of the exposure apparatus and generate high-frequency vibration to impede high-speed and accurate positioning.

Several proposals have been made to solve the problem of the reaction force. For example, an apparatus disclosed in Japanese Patent Laid-Open No. 5-77126 employs a system for preventing swing of the stage platen due to a reaction force by supporting the stator of a linear motor for driving the stage on the floor independently of the stage platen. An apparatus disclosed in Japanese Patent Laid-Open No. 5-121294 uses a system for decreasing swing of the apparatus due to a reaction force by applying, to a machine frame supporting a wafer stage and a projecting lens, a compensation force equivalent to the reaction force according to drive of the stage by a force actuator which generates a force in the horizontal direction.

In both the prior arts, however, although swing of the stage unit itself can be reduced, the reaction force according to drive of the stage is transmitted to the floor directly or through a member which is substantially integrated with the floor. Since the floor vibrates, apparatuses set around the exposure apparatus also vibrate and are adversely affected. Normally, a floor on which an exposure apparatus is set has a natural frequency of about 20 to 40 Hz. When natural vibration of the floor is excited according to the operation of the exposure apparatus, the peripheral apparatuses are considerably adversely affected.

Recently, the stage acceleration is constantly increasing along with improvement of the process speed (throughput). For example, in a step-and-scan exposure apparatus, the maximum acceleration of the reticle stage is 4 G, and that of the wafer stage is 1 G. In addition, the stage mass also increases as the reticle or substrate size increases. For this reason, the driving force defined by <mass of moving body>×<acceleration> is very large, and the reaction force thereof is enormous. Hence, the problem of vibration of the setting floor due to an increase in acceleration and weight is unnegligible.

In addition to the problem of vibration, the apparatuses which are becoming bulky also pose the problem of an increase in occupation area in a manufacturing factory where many manufacturing apparatuses are set.

SUMMARY OF THE INVENTION

The present invention has been made in consideration of the above situation, and has as its object to realize highly accurate stage positioning control by decreasing the influence of vibration or swing according to movement of a stage.

It is another object of the present invention to minimize the influence of a reaction force generated upon acceleration/deceleration of a stage on a floor and prevent vibration from being transmitted to another apparatus set on the same floor.

It is still another object of the present invention to reduce the setting area of a driving apparatus and an exposure apparatus.

A driving apparatus according to the first aspect of the present invention comprises a stage which moves with the object mounted thereon, a base member supporting the stage, a reaction force reception structure for receiving a reaction force generated upon driving the stage, and a damp member for damping transmission of vibration with a predetermined frequency range from the reaction force reception structure to a floor.

In the driving apparatus according to the first aspect of the present invention, preferably, the damp member has an elastic support between the floor or a member substantially equivalent to the floor and the reaction force reception structure, and the reaction force reception structure is supported by the floor or the member substantially equivalent to the floor through the elastic support.

In the driving apparatus according to the first aspect of the present invention, the elastic support preferably elastically supports the reaction force reception structure from a lower side and/or from one side.

The driving apparatus according to the first aspect of the present invention preferably further comprises an application section for applying a force between the base member and the reaction force reception structure.

In the driving apparatus according to the first aspect of the present invention, the application section preferably has an actuator for generating a force in a horizontal direction and/or in a vertical direction.

In the driving apparatus according to the first aspect of the present invention, preferably, the stage moves in a horizontal plane, and the application section comprises an actuator for generating a force in an X direction in the horizontal plane and an actuator for generating a force in a Y direction in the horizontal plane.

In the driving apparatus according to the first aspect of the present invention, the application section preferably comprises a linear motor.

In the driving apparatus according to the first aspect of the present invention, a level of a barycenter of the stage preferably substantially equals a level at which the application section applies the force to the reaction force reception structure.

Preferably, the driving apparatus according to the first aspect of the present invention further comprises a mount between the floor or a member substantially equivalent to the floor and the base member, and the base member is supported by the floor or the member substantially equivalent to the floor through the mount.

In the driving apparatus according to the first aspect of the present invention, the mount preferably comprises an air spring.

In the driving apparatus according to the first aspect of the present invention, the reaction force reception structure is preferably arranged under the base member.

In the driving apparatus according to the first aspect of the present invention, the damp member preferably damps transmission of vibration having a frequency containing a natural frequency of the floor from the reaction force reception structure to the floor.

In the driving apparatus according to the first aspect of the present invention, the damp member preferably damps vibration having a frequency not less than 10 Hz from the reaction force reception structure to the floor.

In the driving apparatus according to the first aspect of the present invention, preferably, the stage moves in a horizontal plane, the damp member has an elastic support between a member fixed to the floor and the reaction force reception structure, and the reaction force reception structure is supported from one side by the member fixed to the floor through the elastic support.

In the driving apparatus according to the first aspect of the present invention, preferably, the stage moves in a horizontal plane, the damp member has an elastic support between the floor or a member substantially equivalent to the floor and the reaction force reception structure, and the reaction force reception structure is supported from a lower side by the floor or the member substantially equivalent to the floor through the elastic support.

The driving apparatus according to the first aspect of the present invention preferably further comprises a stage platen having a reference surface in moving the stage, an interferometer for measuring a vertical position of the stage, and a reference mirror paired with the interferometer, the stage platen being supported by the base member, and the reference mirror being fixed to the stage platen.

The driving apparatus according to the first aspect of the present invention preferably further comprises an air outlet port for supplying a temperature-controlled gas to the stage, the air outlet port being supported by the reaction force reception structure.

The driving apparatus according to the first aspect of the present invention is suitable when the air outlet port has a gas filter.

A driving apparatus according to the second aspect of the present invention comprises a stage which moves with the object mounted thereon, a base member supporting the stage, a reaction force reception structure for receiving a reaction force generated upon driving the stage, a first mechanical filter for damping transmission of vibration between the reaction force reception structure and a floor, and a second mechanical filter for damping transmission of vibration between the base member and the floor.

In the driving apparatus according to the second aspect of the present invention, the first mechanical filter preferably damps transmission of vibration with a frequency not less than 10 Hz.

In the driving apparatus according to the second aspect of the present invention, preferably, a lower limit of the frequency of vibration damped by the first mechanical filter is higher than a lower limit of the frequency of vibration damped by the second mechanical filter.

A driving apparatus according to the third aspect of the present invention comprises a stage which moves with the object mounted thereon, a base member supporting the stage, a reaction force reception structure for receiving a reaction force generated upon driving the stage, and an elastic support interposed between the reaction force reception structure and a floor or a member substantially equivalent to the floor, wherein the reaction force reception structure is supported by the floor or the member substantially equivalent to the floor through the elastic support.

A driving apparatus according to the fourth aspect of the present invention is a driving apparatus for moving an object and comprises a stage which moves with the object mounted thereon, a base member supporting the stage, a reaction force reception structure for receiving a reaction force generated upon driving the stage, and an application section for applying a force between the base member and the reaction force reception structure.

In the driving apparatus according to the fourth aspect of the present invention, preferably, the stage moves in a horizontal plane, and the application section has a plurality of actuators for applying a force in a vertical direction between the base member and the reaction force reception structure.

In the driving apparatus according to the fourth aspect of the present invention, preferably, the stage moves in a horizontal plane, and the application section has an actuator for applying a force in a horizontal direction between the base member and the reaction force reception structure.

In the driving apparatus according to the fourth aspect of the present invention, a level of a barycenter of the stage preferably substantially equals a level at which the actuator applies the force to the reaction force reception structure.

A driving apparatus according to the fifth aspect of the present invention comprises a stage which moves with the object mounted thereon, a base member supporting the stage, a reaction force reception structure for receiving a reaction force generated upon driving the stage, an elastic support interposed between the reaction force reception structure and a floor or a member substantially equivalent to the floor, and a mount interposed between the base member and the floor or the member substantially equivalent to the floor, wherein the elastic support and the mount independently support the reaction force reception structure and the base member, respectively.

A driving apparatus according to the sixth aspect of the present invention comprises a stage which moves with the object mounted thereon, a base member supporting the stage, and a reaction force reception structure for receiving a reaction force generated upon driving the stage.

In the driving apparatus according to the sixth aspect of the present invention, the reaction force reception structure is preferably arranged under the base member.

Preferably, the driving apparatus according to the sixth aspect of the present invention further comprises a mount between the base member and the floor or a member substantially equivalent to the floor, and the base member is elastically supported by the floor or the member substantially equivalent to the floor through the mount.

In the driving apparatus according to the sixth aspect of the present invention, the mount preferably comprises an air spring.

The driving apparatus according to the sixth aspect of the present invention preferably further comprises an air outlet port for supplying a temperature-controlled gas to the stage, the air outlet port being supported by the reaction force reception structure.

In the driving apparatus according to the sixth aspect of the present invention, the air outlet port preferably has a gas filter.

An exposure apparatus according to the seventh aspect of the present invention comprises a projection optical system, a master stage, and a substrate stage to which any one of the above driving apparatuses is applied, wherein a pattern of a master mounted on the master stage is transferred to a substrate mounted on the substrate stage.

An exposure apparatus according to the eighth aspect of the present invention comprises a projection optical system, a master stage to which any one of the above driving apparatuses is applied, and a substrate stage, wherein a pattern of a master mounted on the master stage is transferred to a substrate mounted on the substrate stage.

An exposure apparatus according to the ninth aspect of the present invention comprises a projection optical system, and master and substrate stages to which any one of the above driving apparatuses is applied, wherein a pattern of a master mounted on the master stage is transferred to a substrate mounted on the substrate stage.

An exposure apparatus according to the 10th aspect of the present invention comprises a substrate stage which moves with a substrate mounted thereon, a base member supporting the substrate stage, a plurality of first mounts interposed between the base member and a floor or a member substantially equivalent to the floor to elastically support the base member from a lower side, a master stage which moves with a master mounted thereon, a projection optical system, a lens-barrel platen supporting the master stage and the projection optical system, and a plurality of second mounts interposed between the lens-barrel platen and the floor or the member substantially equivalent to the floor to elastically support the lens-barrel platen from the lower side, wherein when viewed from an upper side, the plurality of first mounts are arranged in an inner region of the plurality of second mounts.

In the exposure apparatus according to the 10th aspect of the present invention, preferably, the substrate stage is supported on the base member by three support legs, and the three support legs are arranged in an inner region of the plurality of first mounts when viewed from the upper side.

In the exposure apparatus according to the 10th aspect of the present invention, preferably, the number of first mounts is three or four, and the number of second mounts is three or four.

In the exposure apparatus according to the 10th aspect of the present invention, preferably, the number of first mounts is three, and the three first mounts are arranged so as to substantially make an isosceles triangle as a triangle having representative points of the first mounts as vertices.

An exposure apparatus according to the 11th aspect of the present invention comprises a substrate stage which moves with a substrate mounted thereon, a base member supporting the substrate stage, a plurality of first mounts interposed between the base member and a floor or a member substantially equivalent to the floor to elastically support the base member from a lower side, a master stage which moves with a master mounted thereon, a projection optical system, a lens-barrel platen supporting the master stage and the projection optical system, and a plurality of second mounts interposed between the lens-barrel platen and the floor or the member substantially equivalent to the floor to elastically support the lens-barrel platen from the lower side, wherein when viewed from an upper side, at least two of a barycenter position of a polygon defined by the plurality of first mounts, a barycenter position of a polygon defined by the plurality of second mounts, and an optical axis of the projection optical system substantially match.

In the exposure apparatus according to the 11th aspect of the present invention, preferably, when viewed from the upper side, all of the barycenter position of the polygon defined by the plurality of first mounts, the barycenter position of the polygon defined by the plurality of second mounts, and the optical axis of the projection optical system substantially match.

In the exposure apparatus according to the 11th aspect of the present invention, preferably, when viewed from the upper side, the master stage moves in a horizontal direction to cross the barycenter position or optical axis.

An exposure apparatus according to the 12th aspect of the present invention comprises a substrate stage which moves with a substrate mounted thereon, a base member supporting the substrate stage, a first reaction force reception structure for receiving a reaction force generated upon driving the substrate stage, a master stage which moves with a master mounted thereon, a projection optical system, a lens-barrel platen supporting the master stage and the projection optical system, and a second reaction force reception structure for receiving a reaction force generated upon driving the master stage.

In the exposure apparatus according to the 12th aspect of the present invention, preferably, the apparatus further comprises a first mount interposed between the base member and a floor or a member substantially equivalent to the floor to elastically support the base member from a lower side, and a second mount interposed between the lens-barrel platen and the floor or the member substantially equivalent to the floor to elastically support the lens-barrel platen from the lower side, and the base member and the lens-barrel platen are independently supported by the first and second mounts, respectively.

The exposure apparatus according to the 12th aspect of the present invention preferably further comprises an actuator for generating a force corresponding to the reaction force generated upon driving the substrate stage to reduce the influence of the reaction force.

The exposure apparatus according to the 12th aspect of the present invention preferably further comprises an actuator for generating a force corresponding to the reaction force generated upon driving the master stage to reduce the influence of the reaction force.

The exposure apparatus according to the 12th aspect of the present invention preferably further comprises a first actuator for generating a force corresponding to the reaction force generated upon driving the substrate stage to reduce the influence of the reaction force, and a second actuator for generating a force corresponding to the reaction force generated upon driving the master stage to reduce the influence of the reaction force.

The exposure apparatus according to the 12th aspect of the present invention preferably further comprises an elastic support interposed between the first reaction force reception structure and a floor or a member substantially equivalent to the floor to elastically support the first reaction force reception structure.

The exposure apparatus according to the 12th aspect of the present invention preferably further comprises an elastic support interposed between the second reaction force reception structure and a floor or a member substantially equivalent to the floor to elastically support the second reaction force reception structure.

The exposure apparatus according to the 12th aspect of the present invention preferably further comprises a first elastic support interposed between the first reaction force reception structure and a floor or a member substantially equivalent to the floor to elastically support the first reaction force reception structure, and a second elastic support interposed between the second reaction force reception structure and the floor or the member substantially equivalent to the floor to elastically support the second reaction force reception structure.

The exposure apparatus according to the 12th aspect of the present invention preferably further comprises a control section for controlling the actuator in accordance with the drive of the substrate stage.

The exposure apparatus according to the 12th aspect of the present invention preferably further comprises a control section for controlling the actuator in accordance with the drive of the master stage.

The exposure apparatus according to the 12th aspect of the present invention preferably further comprises a control section for controlling the first actuator in accordance with the drive of the substrate stage and controlling the second actuator in accordance with the drive of the master stage.

In the exposure apparatus according to the 12th aspect of the present invention, the control section preferably performs feedforward control of the actuator in correspondence with acceleration or deceleration of the substrate stage.

In the exposure apparatus according to the 12th aspect of the present invention, the control section preferably performs feedforward control of the actuator in correspondence with weight movement according to movement of the substrate stage.

In the exposure apparatus according to the 12th aspect of the present invention, preferably, the apparatus further comprises a measurement device for measuring an acceleration of the substrate stage, and the control section controls the actuator on the basis of a measurement result by the measurement device.

A device manufacturing method according to the 13th aspect of the present invention comprises the step of transferring a pattern onto a substrate using the above exposure apparatus.

Further objects, features and advantages of the present invention will become apparent from the following detailed description of the embodiments of the present invention with reference to the accompanying drawings.

DETAILED DESCRIPTION OF THE PREFERRED EMBODIMENT

<Exposure Apparatus>

Figure 1:
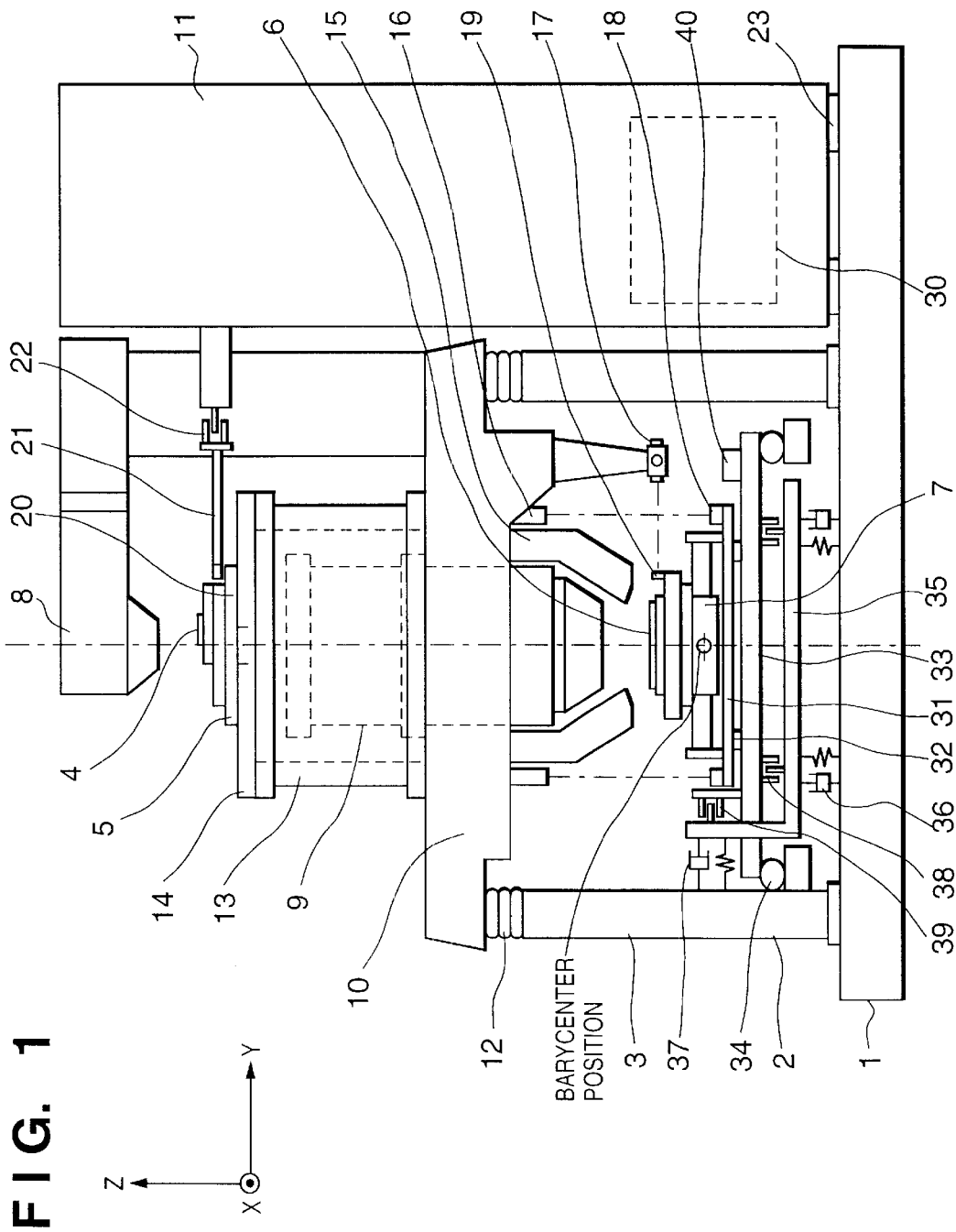
FIG. 1 is a schematic view of an exposure apparatus according to an embodiment of the present invention.
Figure 2:
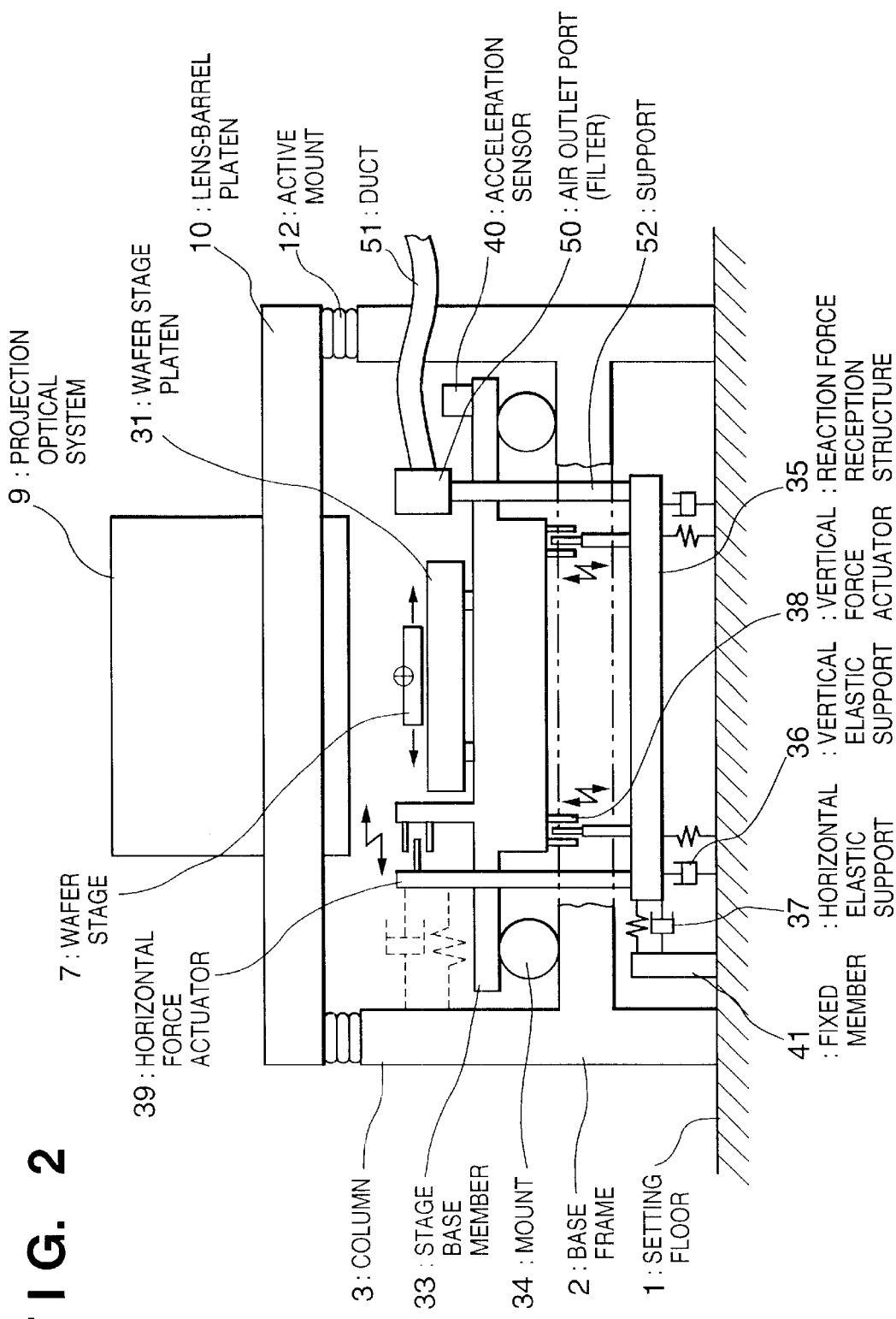
FIG. 2 is an explanatory view of the reaction force reception system of a wafer stage.

An embodiment will be described below in detail with reference to the accompanying drawings. FIG. 1 is a schematic view of an embodiment of an exposure apparatus for manufacturing a semiconductor device. FIG. 2 is an explanatory view of the reaction force reception system of a wafer stage. FIG. 2 illustrates a model, and some members in FIG. 2 have different shapes from those in FIG. 1.

This example is related to a so-called step-and-scan exposure apparatus for performing exposure while synchronously scanning a reticle and a wafer to transfer the reticle pattern to one shot region of the wafer by exposure and moving the wafer stepwise so as to transfer the pattern to a plurality of shot regions. The present invention can be especially effectively applied to a step-and-scan exposure apparatus. However, the present invention is not limited to this and is also effective even for a step-and-repeat exposure apparatus for moving a wafer stage stepwise at a high speed.

Referring to FIG. 1, this apparatus comprises a base frame 2 as the foundation of the exposure apparatus main body, a movable reticle stage 5 on which a reticle 4 having a transfer pattern is mounted, a movable wafer stage 7 on which a wafer 6 (or a glass substrate) as an object to be exposed is mounted, an illumination optical system 8 for illuminating the reticle 4 with illumination light, a projection optical system 9 for reducing and projecting the pattern of the reticle 4 to the wafer 6 at a predetermined magnification (e.g., 4:1), a lens-barrel platen 10 holding the projection optical system 9, and an air conditioner room 11 for supplying temperature-controlled clean air.

The illumination optical system 8 incorporates a light source (e.g., an electric discharge light such as an ultra-high-pressure mercury lamp) or sends illumination light from a light source unit (e.g., an excimer laser unit not shown) placed on the floor independently of the exposure apparatus through a beam line. The illumination optical system 8 generates slit light through various lenses or a stop and illuminates the reticle 4 as a master held on the reticle stage 5 with the slit light from the upper side.

The base frame 2 is set on a setting floor of a clean room in a semiconductor manufacturing factory. The base frame 2 is fixed on a floor 1 at high rigidity, and therefore, can be substantially integrated with the floor 1 or be an extension of the floor 1. The base frame 2 includes three or four columns 3 and supports the lens-barrel platen 10 from the lower side at the upper portions of the columns 3 through three or four active mounts 12. Each active mount 12 incorporates an air spring, a damper, and an actuator to prevent transmission of high-frequency vibration from the floor 1 to the lens-barrel platen 10 and actively compensate for any tilt or swing of the lens-barrel platen 10.

The lens-barrel platen 10 supporting the projection optical system 9 also supports a reticle stage platen 14 through a reticle support frame 13. An alignment detector 15 for detecting the alignment state between the reticle 4 and the wafer 6 is attached to the lens-barrel platen 10, so the two members are aligned using the lens-barrel platen 10 as a reference. To detect the position of the wafer stage 7 with reference to the lens-barrel platen 10, a measuring unit is attached to the lens-barrel platen 10. This measuring unit has a Z interferometer 16 for measuring the position of the wafer stage 7 in the Z direction and an X-Y interferometer 17 for measuring the position of the wafer stage 7 in the X and Y directions. A Z interferometer mirror 18 paired with the Z interferometer 16 is fixed to a wafer stage platen 31, and an X-Y interferometer mirror 19 paired with the X-Y interferometer 17 is fixed to the wafer stage 7. The Z interferometer mirror 18 is attached not to a stage base member 33 but to the stage platen 31 due to the following reasons. The stage platen 31 is close to the stage 7 which must be finally positioned. In addition, although the stage base member 33 may slightly deform when the force actuator is actuated, the stage platen 31 is rarely influenced by operation of the force actuator and allows accurate measurement.

The reticle stage 5 is set on the reticle stage platen 14 and moved by a driving mechanism including a driving source 20 (linear motor) and a static pressure bearing in the left and right directions (Y direction) in FIG. 1 in the order of acceleration, constant speed, and deceleration in scanning/exposure. As will be described later, the stator of the driving source 20 (linear motor) of the reticle stage 5 is connected to the air conditioner room 11 as a reaction force reception structure for the reticle stage 5 through a coupling member 21 and a force actuator 22 (linear motor). With this arrangement, a variable thrust generated by the force actuator 22 can be controlled to act between the driving source 20 and air conditioner room 11.

The structure around the wafer stage as one of the characteristic features of this embodiment will be described next. The wafer stage 7 with the wafer 6 as a substrate mounted thereon can position the mounted wafer 6 in a total of six axial directions, i.e., along moving axes in the horizontal plane (X and Y directions) and in the vertical direction (Z direction) and along rotary axes ($\omega x$, $\omega y$, and $\omega z$) in the respective directions. As the driving source for positioning, a linear motor is employed. Basically, the wafer stage 7 has a two-dimensional stage comprising an X stage which moves straight in the X direction, an X linear motor, a Y stage which moves in the Y direction perpendicular to the X direction, and a Y linear motor. A stage movable in the Z direction, tilt directions ($\omega x$ and $\omega y$), and rotational directions is mounted on the two-dimensional stage. As guides in the respective directions, static pressure bearings are used. For a more detailed structure of the wafer stage 7, see, e.g., Japanese Patent Laid-Open Nos. 1-188241, 3-245932, and 6-267823.

The wafer stage 7 is supported by the stage platen 31 and moves on the X-Y horizontal guide surface (guide surface) of the stage platen 31. The stage platen 31 is supported on the stage base member 33 by three (or four) support legs 32. The support legs 32 have a high rigidity and have no damping function. The stage base member 33 is supported at three portions by the base frame 2 from the lower side through three mounts 34. Most of the weight of the stage base member 33 and members mounted on the stage base member 33 is basically supported by the three mounts 34. The weight received by the mounts 34 is received by the base frame 2 which is substantially integrated with the floor 1. Hence, the basic weight of the wafer stage 7 is essentially supported by the floor 1. As the mounts 34, air springs capable of supporting a large weight are used.

A reaction force reception structure 35 (reaction force reception pallet) with a large mass is located immediately underneath the stage base member 33. Since the reaction force reception structure 35 is located below the stage base member 33, the occupation area of the apparatus on the floor 1 can be reduced.

The reaction force reception structure 35 is supported in the vertical direction by the floor 1 through four vertical elastic supports 36. The reaction force reception structure 35 is supported in the horizontal direction by the side surfaces of the columns 3 around the stage base member 33 (or side surfaces of members fixed to the floor 1) through horizontal elastic supports 37 arranged in the X and Y directions, respectively (FIGS. 1 and 2 illustrate only the horizontal elastic support 37 in the Y direction). Each of the vertical and horizontal elastic supports 36 and 37 has a spring element and a damper element. For example, antivibration rubber members or air springs can be used as the vertical and horizontal elastic supports 36 and 37. As the spring element, a spring or a leaf spring is suitable, and as the damper element, oil viscosity or electromagnetic fluid is suitable. The fact that the elastic support has a spring element and a damper element means that it has a mechanical filter function of damping transmission of vibration within a predetermined frequency range. In this embodiment, the elastic supports 36 and 37 damp transmission of high-frequency vibration containing at least the natural frequency of the floor 1 and that of the apparatus. In FIG. 1, the horizontal elastic supports 37 are interposed between the reaction force reception structure 35 and the columns 3 of the base frame 2. However, as shown in FIG. 2, the horizontal elastic supports 37 may be inserted between fixed members 41 fixed to the floor 1 and the reaction force reception structure 35.

Figure 3:
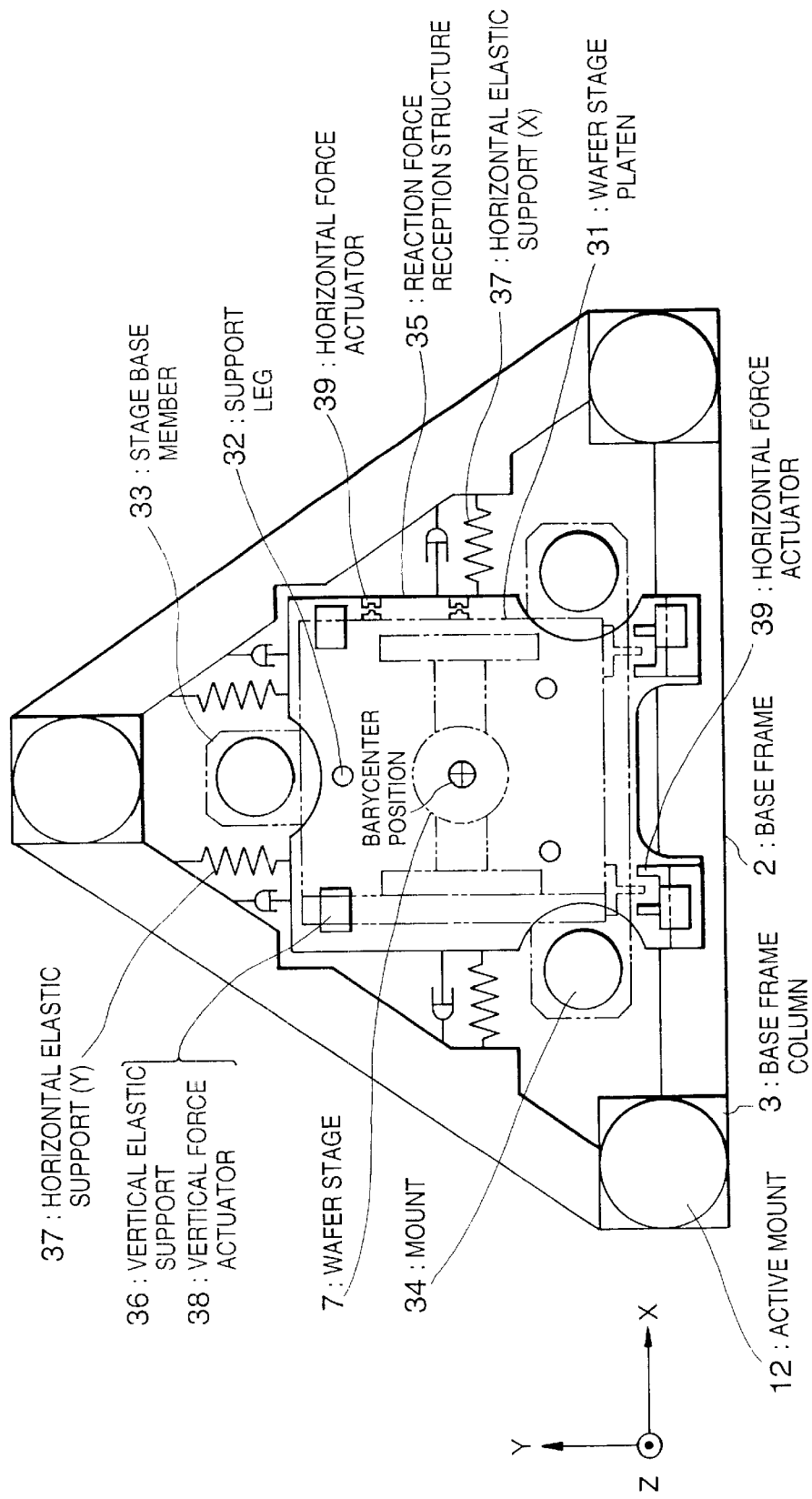
FIG. 3 is a plan view of one form of the reaction force reception system.
Figure 4:
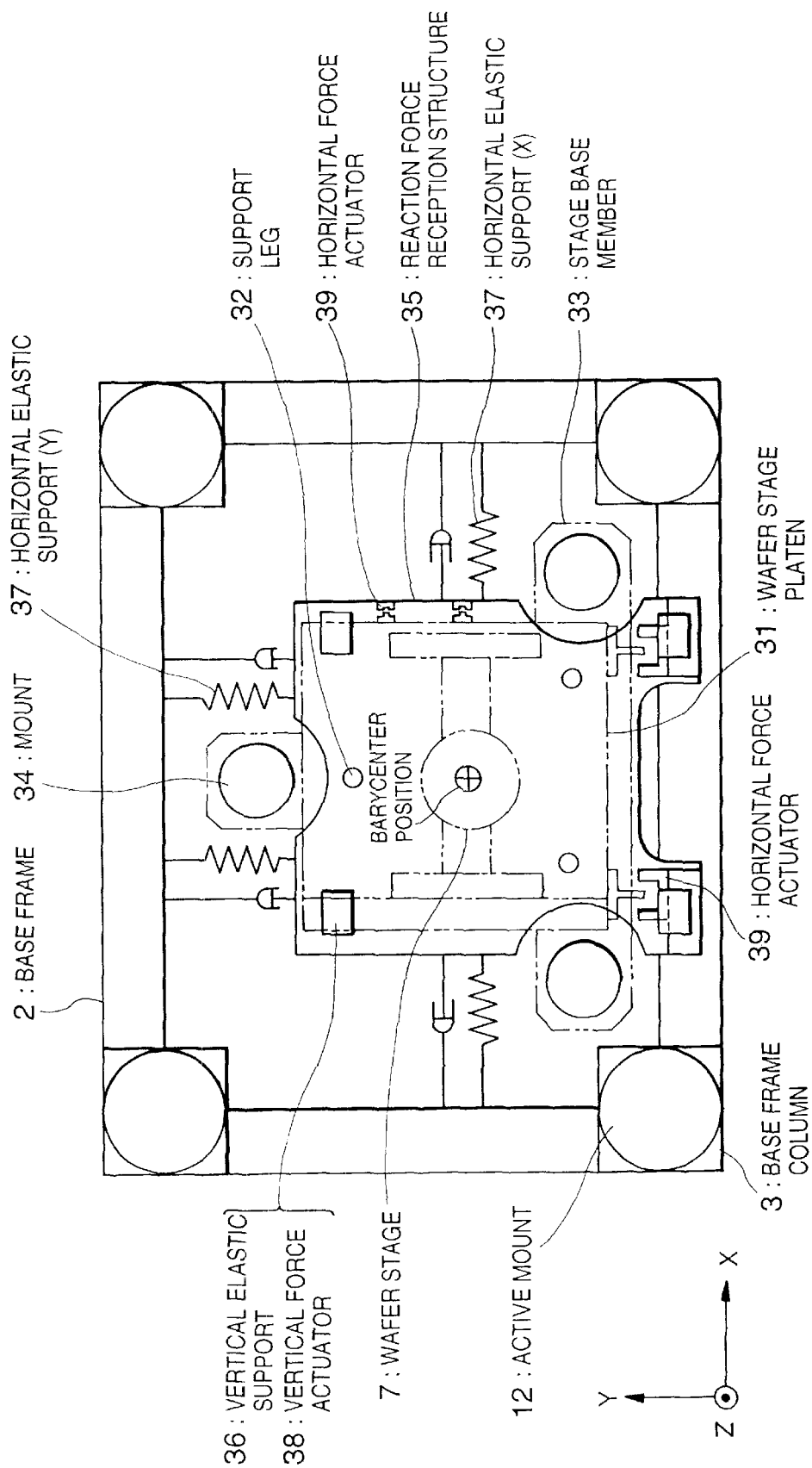
FIG. 4 is a plan view of another form of the reaction force reception system.

Force actuators for generating thrusts in the vertical and horizontal directions are inserted between the stage base member 33 and reaction force reception structure 35. For the vertical direction, a plurality of (four) vertical force actuators 38 are used. For the horizontal direction, a plurality of (two) force actuators are disposed in correspondence with the scanning/exposure direction (Y direction) and a direction (X direction) perpendicular to the scanning/exposure direction, respectively. When viewed from the upper side, the four vertical force actuators 38 are located at almost the same positions as those of the four vertical elastic supports 36 (FIG. 3 or 4). Force transmission between the stage base member 33 and reaction force reception structure 35 can be controlled by variable thrusts generated by these force actuators. The level of the barycenter (indicated by a barycenter symbol in FIG. 1) nearly equals the level of the position of force action of horizontal force actuators 39. For this reason, since a compensation force can be applied to a position at roughly the same level as that where the reaction force acts, the reaction force can be effectively canceled.

An acceleration sensor 40 is attached on the stage base member 33 to measure the acceleration in the vertical and horizontal (Y) directions. The acceleration sensor 40 may be attached on the wafer stage platen 31.

In this embodiment, a linear motor is used as a force actuator. The advantages of use of a linear motor are as follows. Since the control response speed of a linear motor is high, the generated force can be controlled at a high speed. The stator and movable element of a linear motor are noncontact, and a force based on a Lorentz force acts therebetween. For this reason, the driving reaction force of the stage can be transmitted from the stage base member 33 to the reaction force reception structure 35 while maintaining the noncontact state by the Lorentz force. Additionally, the linear motor also has a mechanical filter function for damping vibration transmission due to the noncontact structure. That is, a linear motor has both a function as a noncontact actuator and a function as a mechanical filter and is very suitable for this system. As the force actuator, not only a linear motor using the Lorentz force but also an electromagnetic actuator using an electromagnetic force, a fluid actuator using a fluid pressure such as pneumatic pressure or hydraulic pressure, or a mechanical actuator using a piezoelectric element may be used.

In this system, the reticle stage 5 and projection optical system 9 which are substantially integrated through the lens-barrel platen 10 are substantially supported on the floor 1 from the lower side through the active mounts 12 and the columns 3 of the base frame 2. On the other hand, the wafer stage 7 and stage base member 33 are substantially supported on the floor 1 from the lower side through the mounts 34 and base frame 2. The mounts 34 will be defined as first mounts, and the active mounts 12 will be defined as second mounts. The wafer stage and reticle stage are independently supported on the floor through the first and second mounts, respectively, thereby forming a system free from interference even upon occurrence of vibration or swing.

The stage base member 33 is supported on the floor from the lower side through the mounts 34. The reaction force reception structure 35 is supported on the floor from the lower side through the vertical elastic supports 36. These two members are independently supported by the floor except the force actuators (38 and 39).

FIGS. 3 and 4 are plan views of the constituent members of the reaction force reception system. FIG. 3 shows a case wherein the number of columns 3 (active mounts 12) of the base frame 2 is three. When viewed from the upper side, a triangle formed by connecting the representative points (barycenter positions) of the three mounts 34 and a triangle formed by connecting the representative points (barycenter positions) of the three active mounts 12 are substantially isosceles triangles. The barycenter positions of the two isosceles triangles almost match. The optical axis (barycenter position) of the projection optical system 9 also almost matches the barycenter positions of these triangles.

FIG. 4 shows a case wherein the number of columns 3 (active mounts 12) is four. When viewed from the upper side, the barycenter position of a triangle formed by connecting the representative points (barycenter positions) of the three mounts 34 and that of a rectangle formed by connecting the representative points (barycenter positions) of the four active mounts 12 almost match. The optical axis (barycenter position) of the projection optical system 9 also almost matches these barycenter positions.

The mounts 34 will be defined as first mounts, and the active mounts 12 are defined as second mounts. When viewed from the upper side, the plurality of first mounts are located in the region inside the plurality of second mounts. The wafer stage platen 31 is supported on the stage base member 33 through the three support legs 32. When viewed from the upper side, the three support legs 32 are located in the region inside the plurality of first mounts. When viewed from the upper side, the reticle stage 5 moves to pass through the matching barycenter positions. Hence, the system rarely causes undesirable tilt of the apparatus in high-speed scanning/exposure.

Referring back to FIGS. 1 and 2, the air conditioner room 11 as a reaction force reception structure of the reticle stage is supported on the floor 1 from the lower side through elastic supports 23 having a damping function. The elastic supports 23 serve as mechanical filters and damp transmission of high-frequency vibration containing at least the natural frequency of the floor (e.g., 20 to 40 Hz) and that of the exposure apparatus (e.g., 10 to 30 Hz).

The air conditioner room 11 incorporates a blower fan, a temperature adjustment unit (heater or refrigerator), a chemical filter, and the like and circulates a temperature-controlled gas in the chamber of the exposure apparatus. Basically, the temperature-controlled gas is supplied by downflow from the upper side. The temperature-controlled gas is also locally supplied toward the projection optical system 9 and wafer stage 7 (especially near the laser interferometer optical path). To do this, an air outlet port is provided, and a gas filter for trapping fine particles in the gas is attached to the air outlet port. As shown in FIG. 2, the temperature-controlled gas is supplied from the air conditioner room 11 to an air outlet port 50 through a duct 51. The air outlet port 50 is supported by a support 52 attached to the reaction force reception structure 35. Since the gas filter becomes resistant to the gas flow, the air outlet port considerably vibrates during operation. To cope with this, in this embodiment, the air outlet port 50 having the gas filter is supported by the reaction force reception structure 35 having a large allowance for vibration. That is, when the air outlet port 50 is supported by the reaction force reception structure with a large allowance for vibration, adverse effects of vibration of the air outlet port 50 on the positioning accuracy of the wafer stage 7 can be reduced.

The air conditioner room 11 incorporates a control unit 30 for the exposure apparatus in its lower space. The control unit 30 controls the operation sequence of the exposure apparatus, drive of the force actuators, drive of the active mounts, and the like.

The operation of the apparatus having the above arrangement will be described next. In the basic operation sequence of a step-and-scan exposure apparatus, a step operation for moving the wafer stage stepwise in the X or Y direction to position a shot region where a pattern is to be transferred and a scanning operation for performing scanning/exposure while synchronously moving the reticle stage and wafer stage in the Y direction are repeated. In the scanning operation, the reticle stage 5 and wafer stage 7 are synchronously moved at a constant speed and a predetermined speed ratio (4:1 in this embodiment) relative to slit-shaped illumination light, thereby transferring the entire pattern of the reticle 4 in one shot region of the wafer 6 by scanning/exposure.

In driving the reticle stage 5 and wafer stage 7, acceleration is generated by acceleration at the start of scanning and by deceleration at the end of scanning. The linear motor as a driving source for moving the stages 5 and 7 must generate a driving force corresponding to <mass of stage moving body>×<acceleration>. On the wafer stage 7 side, the reaction force of this driving force acts on the linear motor stator in the horizontal direction and is transmitted from the stator to the stage base member 33 through the stage platen 31 supporting the linear motor. The reaction force is generated only in the horizontal direction (Y direction). However, a moment is generated because the barycenter position level of the driving source of the stage 7 and that of the stage base member 33 are different, and therefore, the influence of the reaction force acts on the stage base member 33 not only in the horizontal direction but also in the vertical direction. Natural vibration of the mechanical system of the exposure apparatus excited by the reaction force produces large vibration.

As a basic technical idea of the reaction force reception system for reducing vibration or swing due to the influence of the reaction force, the reaction force with a vibration frequency within a predetermined range generated upon drive of the stage 7 is let to escape to the reaction force reception structure 35 which is isolated from the floor by the elastic supports 36 and 37. The vibration frequency within a predetermined range means high-frequency vibration of, e.g., 10 Hz or more that covers at least a frequency of 20 to 40 Hz as the natural frequency of the floor. That is, the reaction force reception structure itself may vibrate to reduce vibration of the floor. The lower limit value of the predetermined range is not limited to 10 Hz and can be equal to or smaller than the natural frequency of the floor within the range of about 10 to 40 Hz. The lower limit of the damp frequency of vibration by the elastic supports 36 and 37 is higher than the lower limit of the damp frequency of vibration by the mounts 34.

To realize this, this embodiment has the movable stage 7 on which the object 6 to be exposed, stage base member 33 supporting the stage 7, reaction force reception structure 35 which is different from the stage base member 33 and receives a reaction force according to drive of the stage 7, and elastic supports 36 and 37 elastically supporting the reaction force reception structure 35. Transmission of vibration having a predetermined frequency or more is damped between the reaction force reception structure 35 and the floor by the elastic supports 36 and 37.

The control unit 30 controls drive of the force actuators 38 and 39 by feedforward control (predictive control) in accordance with drive of the stage 7. There are two control modes.

As the first mode, the control unit 30 performs feedforward control of the force actuators 38 and 39 in correspondence with acceleration or deceleration of the stage 7, thereby decreasing vibration or swing of the stage base member 33 due to the reaction force in acceleration/deceleration. More specifically, a force corresponding to the force that acts on the force actuators 38 and 39 due to the reaction force is predicted, and an equivalent force is generated by the force actuators 38 and 39 to cancel the reaction force. The force generated by the force actuators 38 and 39 acts on both the stage base member 33 and reaction force reception structure 35. However, since the reaction force reception structure 35 is supported by the floor 1 or base frame 2 through the elastic supports 36 and 37 (corresponding to a mechanical filter means), transmission of high-frequency vibration to the floor 1 is filtered.

As the second mode, the control unit 30 performs feedforward control of the force actuators 38 and 39 in correspondence with weight movement according to movement of the stage 7. Since the barycenter position of the stage 7 changes in the horizontal direction as the stage 7 moves, the force for tilting the stage base member 33 acts from the wafer stage 7 on the stage base member 33. To reduce this force, weight shift is predicted in accordance with movement of the stage 7, and the forces generated by the plurality of vertical force actuators 38 are individually changed. The weight of the stage base member 33 and movable members thereon is basically supported by the three mounts 34. Only the weight change component by the movement is actively compensated for by the force actuators 38.

The control unit 30 performs not only feedforward control but also feedback control. In feedback control, the accelerations (vertical and horizontal directions) detected by the acceleration sensor 40 attached on the stage base member 33 are fed back to control the vertical and horizontal force actuators 38 and 39, thereby reducing the influence of unpredicted disturbance vibration and further decreasing swing of the wafer stage 7.

The stage base member 33 is substantially elastically supported on the floor 1 or base frame 2 through the mounts 34. The mounts 34 construct mechanical filter means of a certain type and prevent transmission of vibration from the floor 1 to the stage base member 33. With this arrangement, the apparatus of this embodiment satisfies both conditions:

(1) vibration due to the driving reaction force of the stage 7 is not transmitted to the floor, and (2) vibration of the floor is not transmitted to the stage 7.

The reaction force reception system on the wafer stage 7 side have been described above in detail. A reaction force reception system based on the same principle is also formed on the reticle stage 5. More specifically, the system has the lens-barrel platen 10 supporting the reticle stage 5, the mounts (active mounts 12) through which the lens-barrel platen 10 is substantially supported by the floor 1 or base frame 2 from the lower side and which elastically support the lens-barrel platen 10, the reaction force reception structure (air conditioner room 11) which includes the force actuator 22 and receives a reaction force upon driving the reticle stage 5, and the elastic supports 23 through which the reaction force reception structure is substantially supported by the floor 1 or base frame 2 and which elastically support the reaction force reception structure. The control unit 30 performs feedforward control of the force actuator 22 to compensate for the influence of the reaction force according to movement of the reticle stage 5. Since the reaction forces of both of the synchronously moving wafer and reticle stages are received, an excellent step-and-scan exposure apparatus with minimum floor vibration can be provided.

<Device Manufacturing Method>

Figure 5:
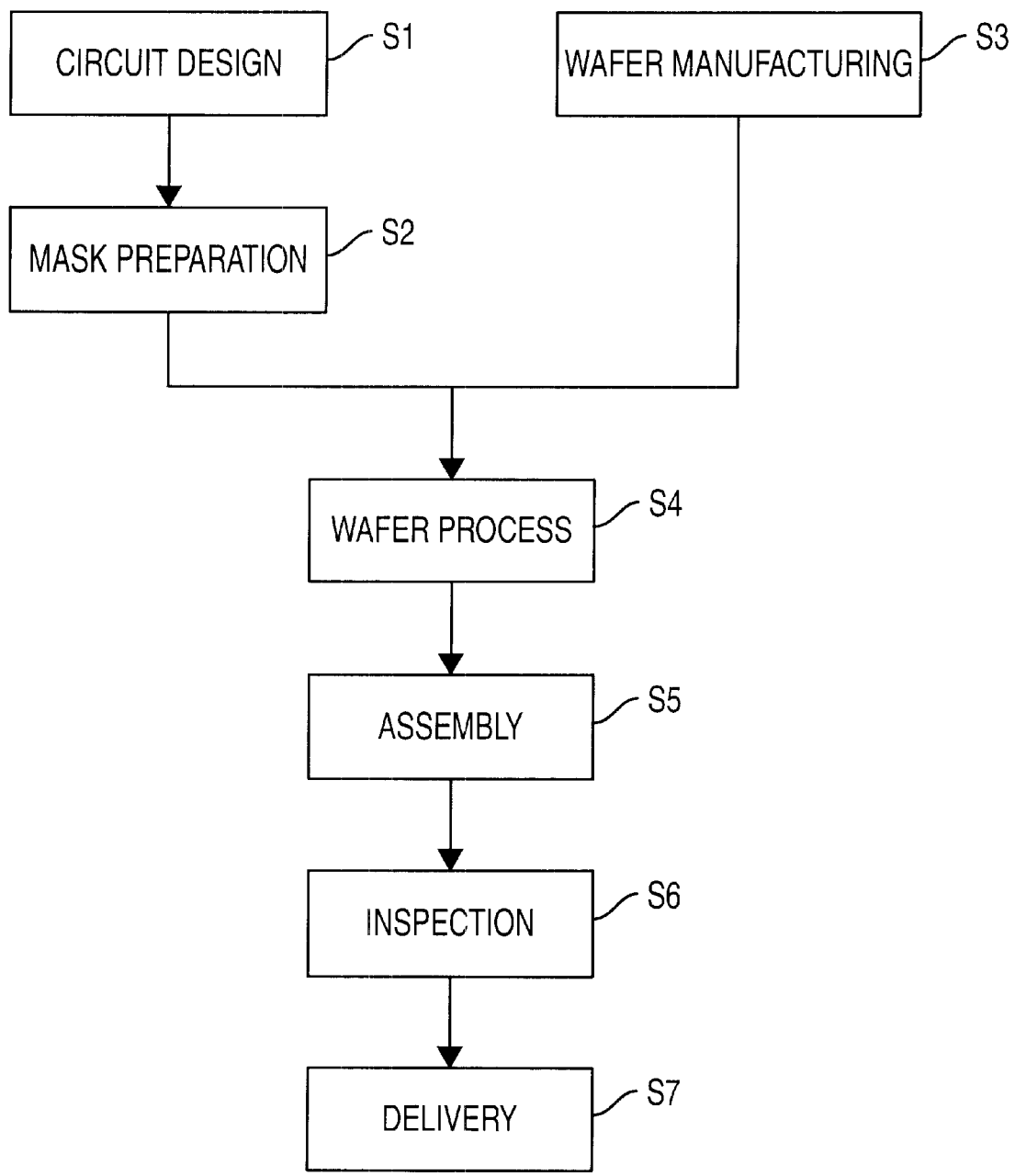
FIG. 5 is a flow chart showing the flow of manufacturing a semiconductor device.

A device manufacturing method using any one of the above-described exposure apparatuses will be described next. FIG. 5 shows the flow of manufacturing a microdevice (e.g., a semiconductor chip such as an IC or an LSI, a liquid crystal panel, a CCD, a thin-film magnetic head, or a micromachine) In step 1 (circuit design), the pattern of a device is designed. In step 2 (reticle preparation), a reticle having the designed pattern is prepared. In step 3 (substrate manufacturing), a substrate is manufactured using a material such as silicon or glass. In step 4 (substrate process) called a preprocess, an actual circuit is formed on the substrate by lithography using the prepared reticle and substrate. In step 5 (assembly), called a post-process, a semiconductor chip is formed from the substrate prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

Figure 6:
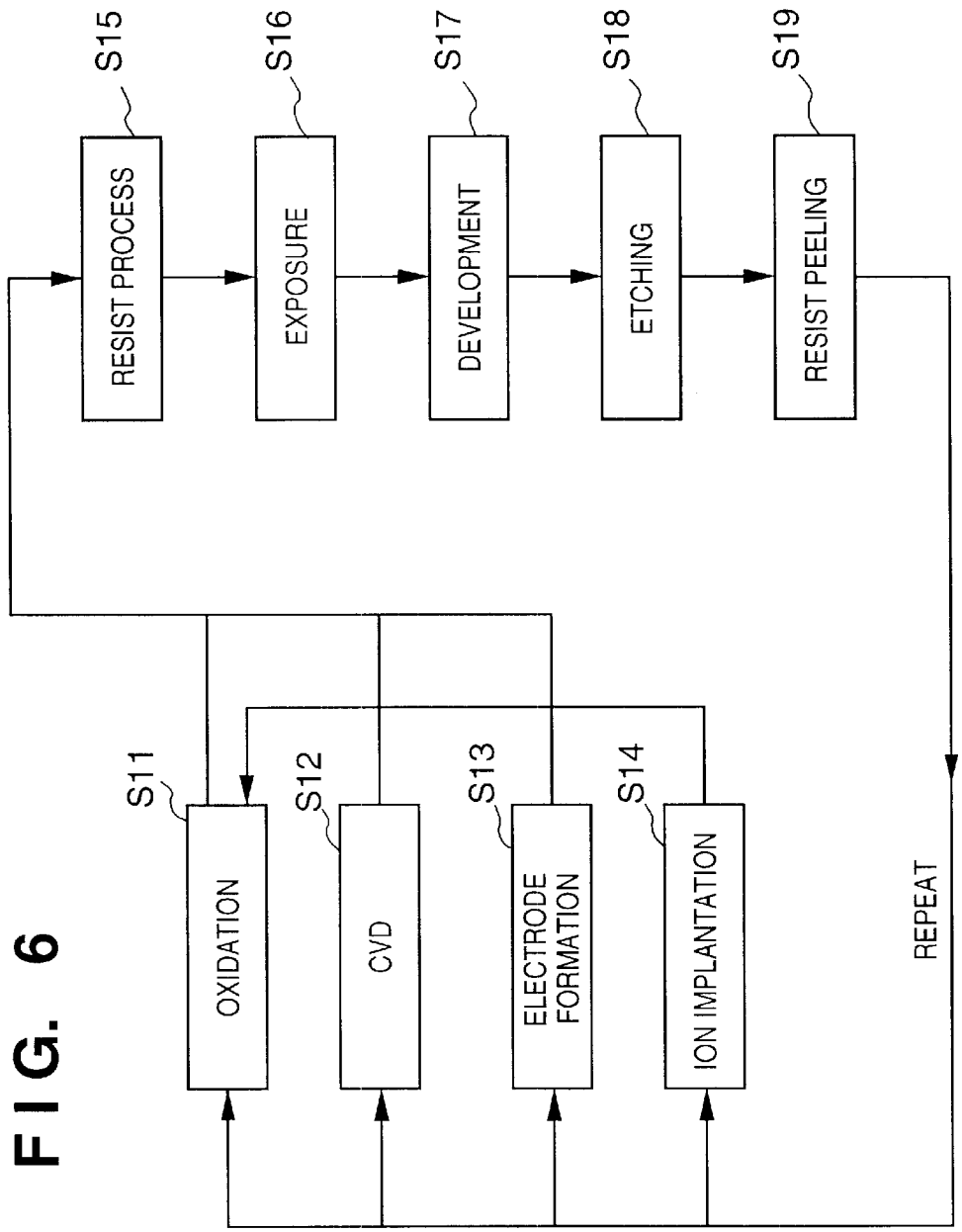
FIG. 6 is a flow chart showing a detailed flow of a substrate process.

FIG. 6 shows details of the substrate process. In step 11 (oxidation), the surface of the substrate is oxidized. In step 12 (CVD), an insulating film is formed on the substrate surface. In step 13 (electrode formation), an electrode is formed on the substrate by deposition. In step 14 (ion implantation), ions are implanted into the substrate. In step 15 (resist process), a resist is applied to the substrate. In step 16 (exposure), the circuit pattern of the reticle is printed in a plurality of shot regions on the substrate by exposure by the above-described exposure apparatus. In step 17 (development), the exposed substrate is developed. In step 18 (etching), portions other than the developed resist image are etched. In step 19 (resist peeling), the resist, unnecessary etching, is removed. By repeating these steps, a multilayered structure of circuit patterns is formed on the substrate. When the production method of this embodiment is used, a high-precision device which is conventionally difficult to manufacture can be manufactured at high producibility, i.e., at low cost.

According to the exposure apparatus of the present invention, high accuracy more than provided by the prior art can be achieved by reducing the influence of vibration or swing due to movement of the stages. By decreasing the influence of the reaction force generated upon accelerating/decelerating the stages on the floor, the influence on other apparatuses set on the same floor can be minimized. In addition, an exposure apparatus capable of preventing an increase in setting area on the floor can be provided. Furthermore, by using the exposure apparatus of the present invention, a device production method with excellent producibility can be provided.

The present invention is not limited to the above embodiments and various changes and modifications can be made within the spirit and scope of the present invention. Therefore, to apprise the public of the scope of the present invention, the following claims are made.

What is claimed is:

1. A driving apparatus for moving an object, comprising:
   a stage which moves with the object mounted thereon;
   a base member supporting said stage;
   a reaction force reception structure for receiving a reaction force generated upon driving said stage;
   a plurality of damp members for damping transmission of vibration from said reaction force reception structure to a floor in a horizontal direction and a vertical direction; and
   a plurality of actuators for generating a force between said base member and said reaction force reception structure in the horizontal direction and the vertical direction.

2. The apparatus according to claim 1, wherein said plurality of damp members has elastic supports between the floor or a member equivalent to the floor and said reaction force reception structure, and said reaction force reception structure is supported by the floor or the member equivalent to the floor through said elastic supports.

3. The apparatus according to claim 2, wherein said elastic supports elastically support said reaction force reception structure from a lower side and from one side.

4. The apparatus according to claim 1, wherein said plurality of damp members damp transmission of vibration with a predetermined frequency range from said reaction force reception structure to the floor.

5. The apparatus according to claim 1, wherein said stage moves in a horizontal plane, and said plurality of actuators comprise a first actuator for generating a force in an X direction in the horizontal plane and a second actuator for generating a force in a Y direction in the horizontal plane.

6. The apparatus according to claim 1, wherein said plurality of actuators comprise linear motors.

7. The apparatus according to claim 1, wherein a level of a barycenter of said stage equals a level at which said plurality of actuators apply the force to said reaction force reception structure.

8. The apparatus according to claim 1, further comprising a mount between the floor or a member equivalent to the floor and said base member, and said base member is supported by the floor or the member equivalent to the floor through said mount.

9. The apparatus according to claim 8, wherein said mount comprises an air spring.

10. The apparatus according to claim 1, wherein said reaction force reception structure is arranged under said base member.

11. The apparatus according to claim 1, wherein said plurality of damp members damp transmission of vibration having a frequency containing a natural frequency of the floor from said reaction force reception structure to the floor.

12. The apparatus according to claim 1, wherein said plurality of damp members damp vibration having a frequency not less than 10 Hz from said reaction force reception structure to the floor.

13. The apparatus according to claim 1, wherein said stage moves in a horizontal plane, said said plurality of damp members has an elastic support between a member fixed to the floor and said reaction force reception structure, and said reaction force reception structure is supported from one side by the member fixed to the floor through said elastic support.

14. The apparatus according to claim 1, wherein said stage moves in a horizontal plane, said plurality of damp members has an elastic support between the floor or a member equivalent to the floor and said reaction force reception structure, and said reaction force reception structure is supported from a lower side by the floor or the member equivalent to the floor through said elastic support.

15. The apparatus according to claim 1, further comprising:
   a stage platen having a reference surface in moving said stage;
   an interferometer for measuring a vertical position of said stage; and
   a reference mirror paired with said interferometer,
   said stage platen being supported by said base member, and said reference mirror being fixed to said stage platen.

16. The apparatus according to claim 1, further comprising an air outlet port for supplying a temperature-controlled gas to said stage, the air outlet port being supported by said reaction force reception structure.

17. The apparatus according to claim 16, wherein the air outlet port has a gas filter.

18. An exposure apparatus comprising:
   a projection optical system;
   a master stage; and
   a substrate stage to which the driving apparatus of claim 1 is applied,
   wherein a pattern of a master mounted on said master stage is transferred to a substrate mounted on said substrate stage.

19. An exposure apparatus comprising:
   a projection optical system;
   a master stage to which the driving apparatus of claim 1 is applied; and
   a substrate stage,
   wherein a pattern of a master mounted on said master stage is transferred to a substrate mounted on said substrate stage.

20. An exposure apparatus comprising:
   a projection optical system; and
   master and substrate stages to which the driving apparatus of claim 1 is applied,
   wherein a pattern of a master mounted on said master stage is transferred to a substrate mounted on said substrate stage.

21. A driving apparatus for moving an object, comprising:
   a stage which moves with the object mounted thereon;
   a base member supporting said stage;
   a reaction force reception structure for receiving a reaction force generated upon driving said stage;
   a plurality of first mechanical filters for damping transmission of vibration between said reaction force reception structure and a floor or a member equivalent to the floor in a horizontal direction and a vertical direction; and
   a second mechanical filter for damping transmission of vibration between said base member and the floor or the member equivalent to the floor.

22. The apparatus according to claim 21, wherein said plurality of first mechanical filters damp transmission of vibration with a frequency not less than 10 Hz.

23. The apparatus according to claim 21, wherein a lower limit of the frequency of vibration damped by said plurality of first mechanical filters is higher than a lower limit of the frequency of vibration damped by said second mechanical filter.

24. An exposure apparatus comprising:

a projection optical system;

a master stage; and a substrate stage to which the driving apparatus of claim 21 is applied, wherein a pattern of a master mounted on said master stage is transferred to a substrate mounted on said substrate stage.

25. An exposure apparatus comprising:

a projection optical system;

a master stage to which the driving apparatus of claim 21 is applied; and a substrate stage, wherein a pattern of a master mounted on said master stage is transferred to a substrate mounted on said substrate stage.

26. An exposure apparatus comprising:

a projection optical system; and master and substrate stages to which the driving apparatus of claim 21 is applied, wherein a pattern of a master mounted on said master stage is transferred to a substrate mounted on said substrate stage.

27. A driving apparatus for moving an object, comprising:

a stage which moves with the object mounted thereon;

a base member supporting said stage;

a reaction force reception structure for receiving a reaction force generated upon driving said stage; and a plurality of elastic supports interposed between said reaction force reception structure and a floor or a member equivalent to the floor, wherein said reaction force reception structure is supported by the floor or the member equivalent to the floor through said plurality of elastic supports in a horizontal direction and a vertical direction.

28. An exposure apparatus comprising:

a projection optical system;

a master stage; and a substrate stage to which the driving apparatus of claim 27 is applied, wherein a pattern of a master mounted on said master stage is transferred to a substrate mounted on said substrate stage.

29. An exposure apparatus comprising:

a projection optical system;

a master stage to which the driving apparatus of claim 27 is applied; and a substrate stage, wherein a pattern of a master mounted on said master stage is transferred to a substrate mounted on said substrate stage.

30. An exposure apparatus comprising:

a projection optical sysytem; and master and substrate stages to which the driving apparatus of claim 27 is applied, wherein a pattern of a master mounted on said master stage is transferred to a substrate mounted on said substrate stage.

31. A driving apparatus for moving an object, comprising:

a stage which moves with the object mounted thereon;

a base member supporting said stage;

a reaction force reception structure for receiving a reaction force generated upon driving said stage;

a plurality of damp members for damping transmission of vibration between said reaction force reception structure and a floor in a horizontal direction and a vertical direction; and an application section for applying a force between said base member and said reaction force reception structure in the horizontal direction and the vertical direction.

32. The apparatus according to claim 31, wherein said stage moves in a horizontal plane, and said application section has a plurality of actuators for applying a force in a vertical direction between said base member and said reaction force reception structure.

33. The apparatus according to claim 31, wherein said stage moves in a horizontal plane, and said application section has an actuator for applying a force in a horizontal direction between said base member and said reaction force reception structure.

34. The apparatus according to claim 33, wherein a level of a barycenter of said stage equals a level at which said actuator applies the force to said reaction force reception structure.

35. An exposure apparatus comprising:

a projection optical system;

a master stage; and a substrate stage to which the driving apparatus of claim 31 is applied, wherein a pattern of a master mounted on said master stage is transferred to a substrate mounted on said substrate stage.

36. An exposure apparatus comprising:

a projection optical system;

a master stage to which the driving apparatus of claim 31 is applied; and a substrate stage, wherein a pattern of a master mounted on said master stage is transferred to a substrate mounted on said substrate stage.

37. An exposure apparatus comprising:

a projection optical system; and master and substrate stages to which the driving apparatus of claim 31 is applied, wherein a pattern of a master mounted on said master stage is transferred to a substrate mounted on said substrate stage.

38. A driving apparatus for moving an object, comprising:

a stage which moves with the object mounted thereon;

a base member supporting said stage;

a reaction force reception structure for receiving a reaction force generated upon driving said stage;

plurality of elastic supports interposed between said reaction force reception structure and a floor or a member equivalent to the floor, for supporting said reaction force reception structure in a horizontal direction and a vertical; and a mount interposed between said base member and the floor or the member equivalent to the floor, wherein said elastic support and said mount independently support said reaction force reception structure and said base member, respectively.

39. An exposure apparatus comprising:
a projection optical system;
a master stage; and
a substrate stage to which the driving apparatus of claim 27 is applied,
wherein a pattern of a master mounted on said master stage is transferred to a substrate mounted on said substrate stage.

40. An exposure apparatus comprising:
a projection optical system;
a master stage to which the driving apparatus of claim 38 is applied; and
a substrate stage,
wherein a pattern of a master mounted on said master stage is transferred to a substrate mounted on said substrate stage.

41. An exposure apparatus comprising:
a projection optical system; and
master and substrate stages to which the driving apparatus of claim 38 is applied,
wherein a pattern of a master mounted on said master stage is transferred to a substrate mounted on said substrate stage.

42. An exposure apparatus comprising:
a substrate stage which moves with a substrate mounted thereon;
a base member supporting said substrate stage;
a plurality of first mounts interposed between said base member and a floor or a member equivalent to the floor to elastically support said base member from a lower side;
a master stage which moves with a master mounted thereon;
a projection optical system;
a lens-barrel platen supporting said master stage and said projection optical system; and
a plurality of second mounts interposed between said lens-barrel platen and the floor or the member equivalent to the floor to elastically support said lens-barrel platen from the lower side,
wherein when viewed from an upper side, an optical axis of said projection optical system matches at least one of a barycenter position of a polygon defined by said plurality of first mounts and a barycenter position of a polygon defined by said plurality of second mounts.

43. The apparatus according to claim 42, wherein when viewed from the upper side, all of the barycenter position of the polygon defined by said plurality of first mounts, the barycenter position of the polygon defined by said plurality of second mounts, and the optical axis of said projection optical system match.

44. The apparatus according to claim 42, wherein when viewed from the upper side, said master stage moves in a horizontal direction to cross the barycenter position or an optical axis.

45. An exposure apparatus comprising:
a substrate stage which moves with a substrate mounted thereon;
a base member supporting said substrate stage;
a first reaction force reception structure for receiving a reaction force generated upon driving said substrate stage;
a plurality of actuators for generating a force between said base member and said first reaction force reception structure in a horizontal direction and a vertical direction;
a master stage which moves with a master mounted thereon;
a projection optical system;
a lens-barrel platen supporting said master stage and said projection optical system, wherein said base member and said lens barrel platen are independently supported; and
a second reaction force reception structure for receiving a reaction force generated upon driving said master stage.

46. The apparatus according to claim 45, wherein the apparatus further comprises
a first mount interposed between said base member and a floor or a member equivalent to the floor to elastically support said base member from a lower side, and
a second mount interposed between said lens-barrel platen and the floor or the member equivalent to the floor to elastically support said lens-barrel platen from the lower side, and
said base member and said lens-barrel platen are independently supported by said first and second mounts, respectively.

47. The apparatus according to claim 45, further comprising a second actuator for generating a force between said lens barrel platen and said second reaction force reception structure.

48. The apparatus according to claim 47, further comprising a control section for controlling said actuator in accordance with driving of said master stage.

49. The apparatus according to claim 47, further comprising a control section for controlling said plurality of actuators in accordance with driving of said substrate stage and controlling said second actuator in accordance with driving of said master stage.

50. The apparatus according to claim 45, further comprising an elastic support interposed between said first reaction force reception structure and a floor or a member equivalent to the floor to elastically support said first reaction force reception structure.

51. The apparatus according to claim 45, further comprising an elastic support interposed between said second reaction force reception structure and a floor or a member equivalent to the floor to elastically support said second reaction force reception structure.

52. The apparatus according to claim 45, further comprising:
a first elastic support interposed between said first reaction force reception structure and a floor or a member equivalent to the floor to elastically support said first reaction force reception structure; and
a second elastic support interposed between said second reaction force reception structure and the floor or the member equivalent to the floor to elastically support said second reaction force reception structure.

53. The apparatus according to claim 45, further comprising a control section for controlling said plurality of actuators in accordance with driving of said substrate stage.

54. The apparatus according to claim 53, wherein said control section performs feedforward control of said plurality of actuators in correspondence with acceleration or deceleration of said substrate stage.

55. The apparatus according to claim 53, wherein said control section performs feedforward control of said plurality of actuators in correspondence with weight movement according to movement of said substrate stage.

56. The apparatus according to claim 53, further comprising a measurement device for measuring an acceleration of said substrate stage, wherein said control section controls said plurality of actuators on the basis of a measurement result by said measurement device.

57. A device manufacturing method comprising the steps of:

providing an exposure apparatus that includes
        (i) a projection optical system,
        (ii) a master stage and
        (iii) a substrate stage to which a driving apparatus is applied, the driving apparatus including
        (a) a stage which moves with the object mounted thereon,
        (b) a base member supporting the stage,
        (c) a reaction force reception structure for receiving a reaction force generated upon driving the stage and
        (d) a plurality of damp members arranged between the reaction force reception structure and a floor in a horizontal direction and a vertical direction;

applying a resist film to a substrate; and transferring a pattern of a master mounted on the master stage onto the substrate, which is mounted on the substrate stage.

\* \* \* \* \*

UNITED STATES PATENT AND TRADEMARK OFFICE
CERTIFICATE OF CORRECTION

PATENT NO.    : 6,493,062 B2
DATED         : December 10, 2002
INVENTOR(S)   : Yukio Tokuda et al.

It is certified that error appears in the above-identified patent and that said Letters Patent is hereby corrected as shown below:

Title page,
Item [*] Notice, insert -- This patent issued on a continued prosecution application filed under 37 CFR 1.53(d), and is subject to the twenty year patent term provisions of 35 U.S.C. 154(a)(2) --.

Column 14,
Line 26, "micromachine)" should read -- micromachine). --.
Line 54, "etching," should read -- after etching, --.

Column 15,
Line 67, "said said" should read -- said --.

Column 18,
Line 61, "plurality" should read -- a plurality --.
Line 65, "vertical;" should read -- vertical direction; --.

Column 19,
Line 8, "27" should read -- 38 --.

Column 20,
Line 15, "comprises" should read -- comprises: --.

Signed and Sealed this

Sixteenth Day of September, 2003

JAMES E. ROGAN
*Director of the United States Patent and Trademark Office*